US012779741B2

(12) United States Patent
Blackshear et al.

(10) Patent No.: US 12,779,741 B2
(45) Date of Patent: Nov. 3, 2026

(54) MOLD MASTER FABRICATION FOR INJECTION MOLDING USING PHYSICAL VAPOR DEPOSITION, ELECTROFORMING, AND DIE-SINK DISCHARGE MACHINING

(71) Applicant: Southwest Research Institute, San Antonio, TX (US)

(72) Inventors: Samuel Joseph Blackshear, Lakehills, TX (US); Albert Joseph Parvin, Jr., San Antonio, TX (US); Matthew Louis Capps, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 98 days.

(21) Appl. No.: 18/823,815

(22) Filed: Sep. 4, 2024

(65) Prior Publication Data

US 2026/0061665 A1 Mar. 5, 2026

(51) Int. Cl.

| | |
|---|---|
| ***B29C 33/38*** | (2006.01) |
| ***C23C 16/06*** | (2006.01) |
| ***C23C 16/503*** | (2006.01) |
| ***C23C 16/505*** | (2006.01) |

(52) U.S. Cl.

CPC .......... *B29C 33/3842* (2013.01); *C23C 16/06* (2013.01); *C23C 16/503* (2013.01); *C23C 16/505* (2013.01)

(58) Field of Classification Search

None

See application file for complete search history.

(56) References Cited

U.S. PATENT DOCUMENTS

| | | | | | |
|---|---|---|---|---|---|
| 3,876,389 | A * | 4/1975 | Chaudhari | B29C 70/62 | 428/416 |
| 5,439,622 | A * | 8/1995 | Pennisi | B29C 33/565 | 264/129 |
| 5,453,173 | A * | 9/1995 | Oyama | C25D 1/10 | 425/84 |
| 5,470,651 | A * | 11/1995 | Milinkovic | C23C 16/16 | 428/458 |
| 5,700,307 | A * | 12/1997 | Kashiwagi | B32B 15/01 | 65/374.13 |
| 5,730,582 | A * | 3/1998 | Heitmann | F04D 29/284 | 416/185 |
| 6,279,425 | B1 * | 8/2001 | Cicotte | B21D 37/20 | 72/709 |
| 10,900,136 | B2 * | 1/2021 | Li | B29C 64/153 | |
| 2003/0157347 | A1 * | 8/2003 | Zhang | C23C 16/01 | 249/134 |
| 2006/0096865 | A1 * | 5/2006 | Keller | B29D 11/00009 | 205/70 |

(Continued)

*Primary Examiner* — Emmanuel S Luk

(74) *Attorney, Agent, or Firm* — Livingston Law Firm

(57) ABSTRACT

A method of fabricating a master mold for a part begins with using a physical vapor deposition (PVD) process to cover the part to be molded, thereby generating a conductive metal coating. Next, an electroforming process is used to thicken the conductive metal coating, thereby generating an electroformed shell. The outer surface of this shell is used as the electrode for a die-sink electrical discharge machining process, to form a surface conforming to the outer surface of the electroformed shell in a mold blank. The shell and the mold blank are then bonded together, such that the inside surface of the shell is a negative of the part to be molded.

7 Claims, 2 Drawing Sheets

(56) References Cited

U.S. PATENT DOCUMENTS

| | | | | |
|---|---|---|---|---|
| 2006/0202385 | A1* | 9/2006 | Xu | B29C 33/3878 425/542 |
| 2007/0125651 | A1* | 6/2007 | Buckley | C25D 11/02 205/67 |
| 2007/0126148 | A1* | 6/2007 | Coyle | B29C 43/46 264/299 |
| 2007/0235902 | A1* | 10/2007 | Fleming | B81C 99/009 264/237 |
| 2008/0138510 | A1* | 6/2008 | Wu | B29C 45/2642 425/112 |
| 2008/0315459 | A1* | 12/2008 | Zhang | B29C 33/424 252/60 |
| 2009/0295024 | A1* | 12/2009 | Watanabe | G03F 7/0002 264/293 |
| 2010/0304087 | A1* | 12/2010 | Kusuura | B29C 33/424 264/293 |
| 2011/0233820 | A1* | 9/2011 | Watanabe | C08L 83/16 264/293 |
| 2016/0141528 | A1* | 5/2016 | Masuyama | H10K 77/10 257/40 |
| 2016/0158513 | A1* | 6/2016 | Ryu | A61M 37/0015 604/103.08 |
| 2019/0070754 | A1* | 3/2019 | Ogawa | B29C 33/3842 |
| 2021/0298677 | A1* | 9/2021 | Dana | B29D 11/00865 |

* cited by examiner

MOLD MASTER FABRICATION FOR INJECTION MOLDING USING PHYSICAL VAPOR DEPOSITION, ELECTROFORMING, AND DIE-SINK DISCHARGE MACHINING

BACKGROUND OF THE INVENTION

Injection molding is a manufacturing process for producing parts by injecting molten material into a mold. Injection molding is used for manufacturing a wide variety of parts of all sizes.

After a product is designed, a mold for it, or for parts of it, is made from metal, such as steel or aluminum. Conventionally, the mold is made by precision-machining to form the features of the desired part as a mold cavity.

Injection molding can be performed with a host of materials mainly including metals (for which the process is called die-casting), glasses, elastomers, confections, and most commonly thermoplastic and thermosetting polymers. The molten material for the part is injected into the mold cavity, where it cools and hardens to the configuration of the cavity.

Creating mold masters is an integral but often challenging part of the injection molding process. Traditional manufacturing techniques for mold masters have several disadvantages. They are often high-cost endeavors requiring specialized tooling, particularly for intricate or specialized items like optical components or parts with complex surface details. These methods are also time-consuming, often involving labor-intensive processes such as subtractive machining that can require weeks to complete a single mold master. Additionally, achieving high levels of detail and surface finish typically necessitates extra post-processing steps, further escalating both the time and cost involved. Scalability is also a significant issue; producing multiple copies of a mold master is neither time-efficient nor cost-effective using traditional methods.

DETAILED DESCRIPTION OF THE INVENTION

The following invention is directed to a method for mold master fabrication for injection molding. The method integrates Physical Vapor Deposition (PVD), electroforming, and Electrical Discharge Machining (EDM) processes. As explained below, a shell over a master part is created through a unique combination of metallization via PVD and subsequent electroforming to enhance the shell's thickness. This shell is then used as an electrode in an EDM process to create a negative in a mold blank.

Figure 1:
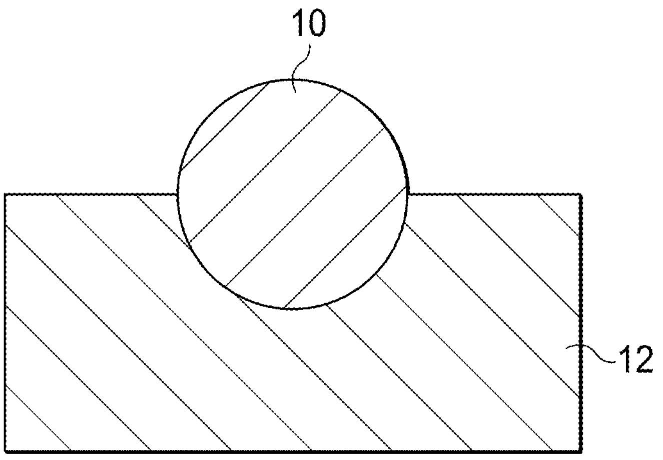
FIG. 1 illustrates preparation of a master part for the Physical Vapor Deposition (PVD) step of the mold master fabrication process.

FIG. 1 illustrates preparation of a part 10 for the PVD step of the mold master fabrication process. For purposes of illustration, part 10 is overly simplified as a hemisphere; the process is suitable for complex parts. For simple or complex parts, conventional mold design strategies may be used to develop how a single or multiple mold pieces are to be used to create a complete mold. On this note, it should be understood that for a part requiring multiple mold pieces, the term "mold" as used herein also applies to a mold piece and the "part" may be a portion of a larger part.

Part 10 is a "master part" and may be conductive or non-conductive. It is cleaned to ensure optimal adhesion and is placed in or on a holder 12.

Figure 2:
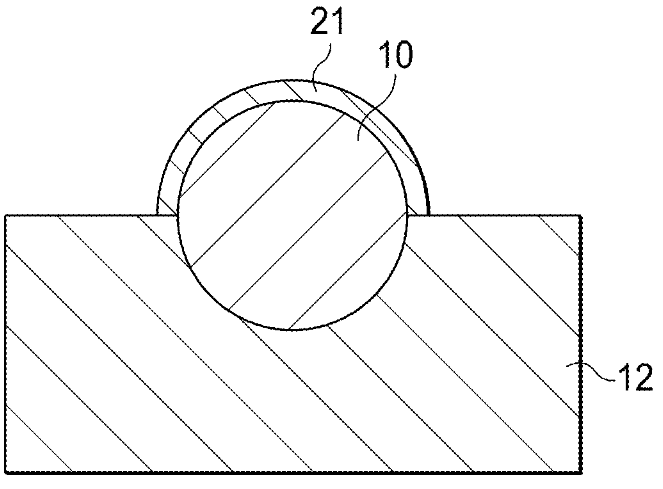
FIG. 2 illustrates how the PVD process applies a conductive metal coating on the master part.

FIG. 2 illustrates how the PVD process applies a conductive metal coating 21 on the master part 10. Coating 21 is a thin conductive film, such as copper or chromium, uniformly deposited. The PVD deposition process is versatile, suitable for both conductive and non-conductive master part materials.

Various PVD techniques may be used, such as but not limited to Direct Current (DC) sputtering and Radio Frequency (RF) sputtering. For parts with high-fidelity details, a combination of PVD methods, such as DC and RF sputtering, can be used to ensure full conductive film coverage of the master part. The thickness and uniformity of the deposited layer may be verified to ensure it meets specification requirements.

The metalized coating 21 as deposited by the PVD process is thin (microns or less) and delicate. During this step, part 10 is handled carefully to avoid scratching or contaminating the surface of the PVD coating 21.

Figure 3:
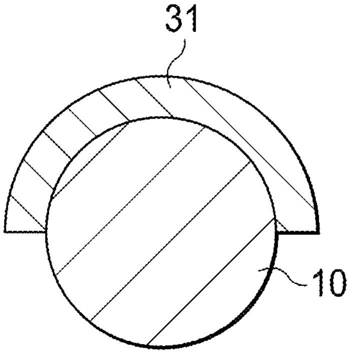
As shown in FIG. 3, the master part with its PVD coating undergoes an electroforming process to create an electroformed shell.

As shown in FIG. 3, the master part 10 with its PVD coating 21 undergoes an electroforming process to create an electroformed shell 31. It is prepared for electroforming by securing it within an electroforming bath. Part 10 is normally transferred from the PVD coating step to the electroforming process within minutes. This minimizes contamination to the PVD coating 21 from the environment.

Electroforming enhances the thickness of the applied PVD material layer. More specifically, the electroforming process transforms the thin and delicate PVD coating 21 into a thicker electroformed shell 31. Shell 31 can be safely handled with bare hands and an ordinary amount of care. The electroformed shell 31 is a negative of part 10 and a robust structure. Post-electroforming, the thickness and consistency of shell 31 may be validated.

Figure 4:
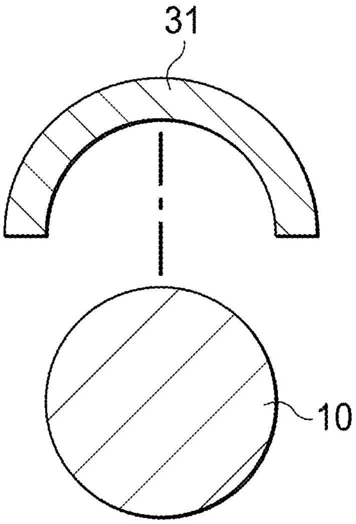
As shown in FIG. 4, typically, the electroformed shell may then be separated from the master part.

As shown in FIG. 4, typically, the electroformed shell 31 is then separated from master part 10. After finishing the electroforming process, the resulting shell 31 is thick enough to be mechanically rigid and self-supporting and to withstand a subsequent EDM process. In other embodiments of the method, part 10 may be loosened to minimize difficulties in releasing part 10 from shell 31 after the EDM process. Thus, the master part 10 can be left inside shell 31 during the EDM process, or it could be removed before EDM.

Figure 5:
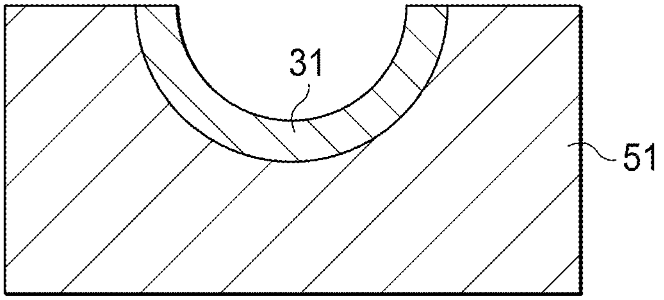
FIG. 5 illustrates how the electroformed shell is next plunged into an EDM apparatus (not shown) for EDM.

FIG. 5 illustrates how the electroformed shell 31 is next plunged into an EDM apparatus (not shown) for EDM. In FIG. 5, part 10 has been removed from shell 31, but as stated above, in other embodiments it may remain.

The outer surface of the electroformed shell 31, which does not form part of the mold, serves as a die-sink EDM electrode. This electrode is used to create a matching pocket within a mold blank 51. The EDM process may be a "sinker" process in which the shell 31 (or coated master part) is the electrode and the mold blank 51 (the workpiece) are both submerged in dielectric fluid. The EDM process creates a highly accurate negative replica of the host part 10.

More specifically, during the EDM process, the electrode and the workpiece are submerged in a dielectric fluid and a potential difference is applied between them. As the electrode approaches the workpiece, sparks jump across the gap, removing material from the workpiece and forming the desired shape. In this manner, the electrode (shell 31) will create a negative impression in the mold blank 51.

While the outer surface of shell 31 has been employed for EDM machining, the inner surface of shell 31, which is the crucial molding surface, has remained protected and unexposed during the entire process. The inner surface of shell 31 is protected from any EDM losses sustained by the outer surface.

The EDM process is followed by bonding the electrode (the electroformed shell 31) and the mold blank together. Any additional features necessary for the injection molding process can be added through supplementary machining techniques. The complete form results in the mold master.

The above-described master mold fabrication process offers several advantages. It aims to reduce production costs and time. Unlike traditional methods, the method can replicate intricate surface features, including finishes and roughness levels, without the need for additional post-processing. The method targets many manufacturing sectors, such as automotive, medical, and consumer electronics, where rapid, economical mold master creation is imperative. Moreover, this method shows particular advantages in molding optical components like lenses and mirrors.

The invention claimed is:

1. A method of fabricating a master mold for a part, comprising:

using a physical vapor deposition (PVD) process to cover the part to be molded, thereby generating a conductive metal coating;

using an electroforming process to thicken the conductive metal coating, thereby generating an electroformed shell having an inner surface and an outer surface;

using the outer surface of the electroformed shell as the electrode for a die-sink electrical discharge machining process, such that a mold conforming to the outer surface of the electroformed shell is formed in a mold blank; and bonding the electroformed shell and the mold blank together.

2. The method of claim 1, wherein the conductive metal coating is copper, nickel, or chromium.

3. The method of claim 1, wherein the part is conductive.

4. The method of claim 1, wherein the part is non-conductive.

5. The method of claim 1, wherein the PVD process is Direct Current (DC) sputtering process.

6. The method of claim 1, wherein the PVD process is a Radio Frequency (RF) sputtering process.

7. The method of claim 1, further comprising removing the part from the electroformed shell process to the step of using the outer surface of the electroformed shell as the electrode for a die-sink electrical discharge machining process.

* * * * *